(12) United States Patent
Chueh

(10) Patent No.: US 10,079,588 B2
(45) Date of Patent: Sep. 18, 2018

(54) POWER DIVIDING CIRCUIT AND POWER DIVIDER

(71) Applicant: NANNING FUGUI PRECISION INDUSTRIAL CO. LTD., Nanning (CN)

(72) Inventor: Yu-Chih Chueh, New Taipei (TW)

(73) Assignee: NANNING FUGUI PRECISION INDUSTRIAL CO. LTD., Nanning (CN)

( * ) Notice: Subject to any disclaimer, the term of this patent is extended or adjusted under 35 U.S.C. 154(b) by 10 days.

(21) Appl. No.: 15/235,390

(22) Filed: Aug. 12, 2016

(65) Prior Publication Data

US 2017/0338794 A1    Nov. 23, 2017

(30) Foreign Application Priority Data

May 20, 2016 (TW) .............................. 105115886 A

(51) Int. Cl.
  *H03H 7/46* (2006.01)
  *H03H 7/38* (2006.01)
  *H03H 7/01* (2006.01)

(52) U.S. Cl.
  CPC ............ *H03H 7/46* (2013.01); *H03H 7/1783* (2013.01); *H03H 7/38* (2013.01)

(58) Field of Classification Search
  CPC ........... H03H 7/46; H03H 7/1783; H03H 7/38

USPC .................................................. 333/125–129
See application file for complete search history.

(56) References Cited

U.S. PATENT DOCUMENTS 4,725,794 A * 2/1988 Barczys ................. H03H 11/36
                                                                                  333/100

FOREIGN PATENT DOCUMENTS

CN              102881981 A *   1/2013

* cited by examiner

Primary Examiner — Robert J Pascal
Assistant Examiner — Kimberly Glenn
(74) Attorney, Agent, or Firm — ScienBiziP, P.C.

(57) ABSTRACT

A power dividing circuit includes an input port, a first microstrip line, a first transmission subcircuit, a second transmission subcircuit, and a matching element. The first transmission subcircuit is coupled to a first microstrip line first end, and the first transmission subcircuit includes a first output port and a first resonance unit. The second transmission subcircuit is coupled to a first microstrip line second end, and the second transmission subcircuit includes a second output port and a second resonance unit. The matching element is coupled between the first output port and the second output port, the matching element matches impedances between the first transmission subcircuit and the second transmission subcircuit. A power divider is also provided.

12 Claims, 4 Drawing Sheets

POWER DIVIDING CIRCUIT AND POWER DIVIDER

FIELD

The subject matter herein generally relates to a power dividing circuit and a power divider.

BACKGROUND

A power divider is used in a microwave system. When a microwave device is to be installed with a power divider, the size or power dividing effect of the power divider may be a problem for the microwave device.

BRIEF DESCRIPTION OF THE DRAWINGS

Implementations of the present technology will now be described, by way of example only, with reference to the attached figures.

DETAILED DESCRIPTION

Figure 1:
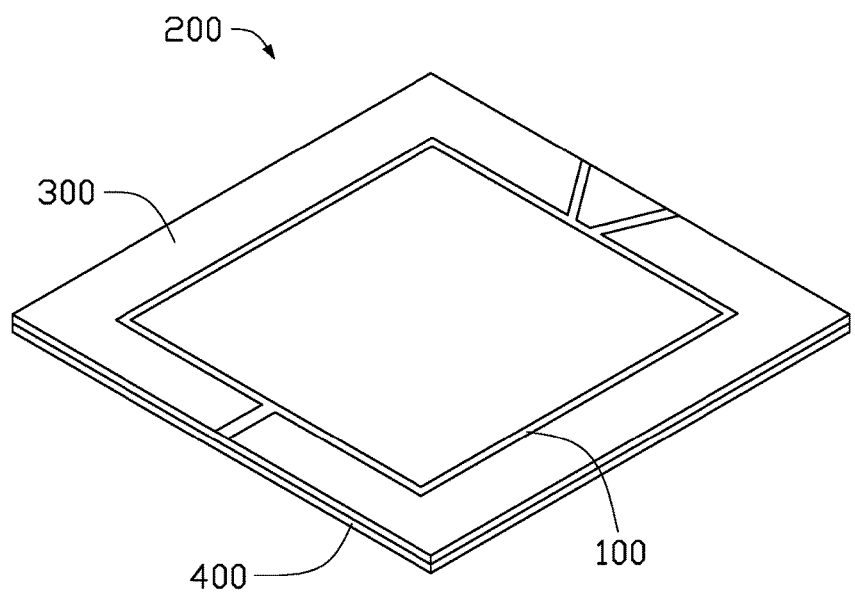
FIG. 1 is a structure diagram of an embodiment of a power divider of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently coupled or releasably coupled. The term "comprising," when utilized, means "including, but not necessarily limited to"; it specifically indicates open-ended inclusion or membership in the so-described combination, group, series, and the like.

The disclosure will now be described in relation to a power divider.

FIG. 1 illustrates an embodiment of a power divider 200. The power divider 200 comprises a power dividing circuit 100, a basal board 300 and a grounded board 400. The power dividing circuit 100 is installed on a basal board 300 upper surface, and the grounded board 400 is attached to a basal board 300 lower surface.

Figure 2:
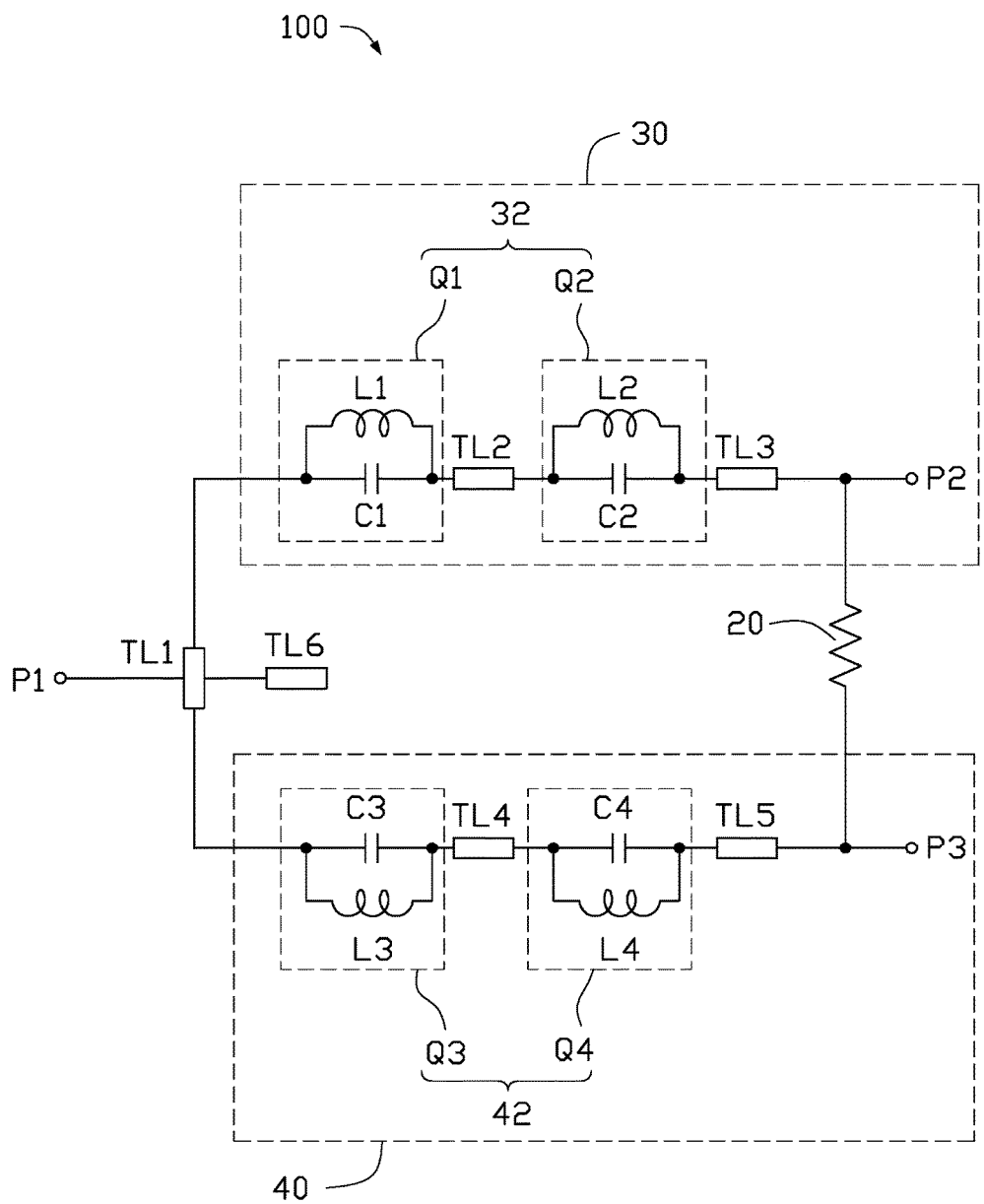
FIG. 2 is a circuit diagram of an embodiment of a power dividing circuit of the present disclosure.
Figure 3:
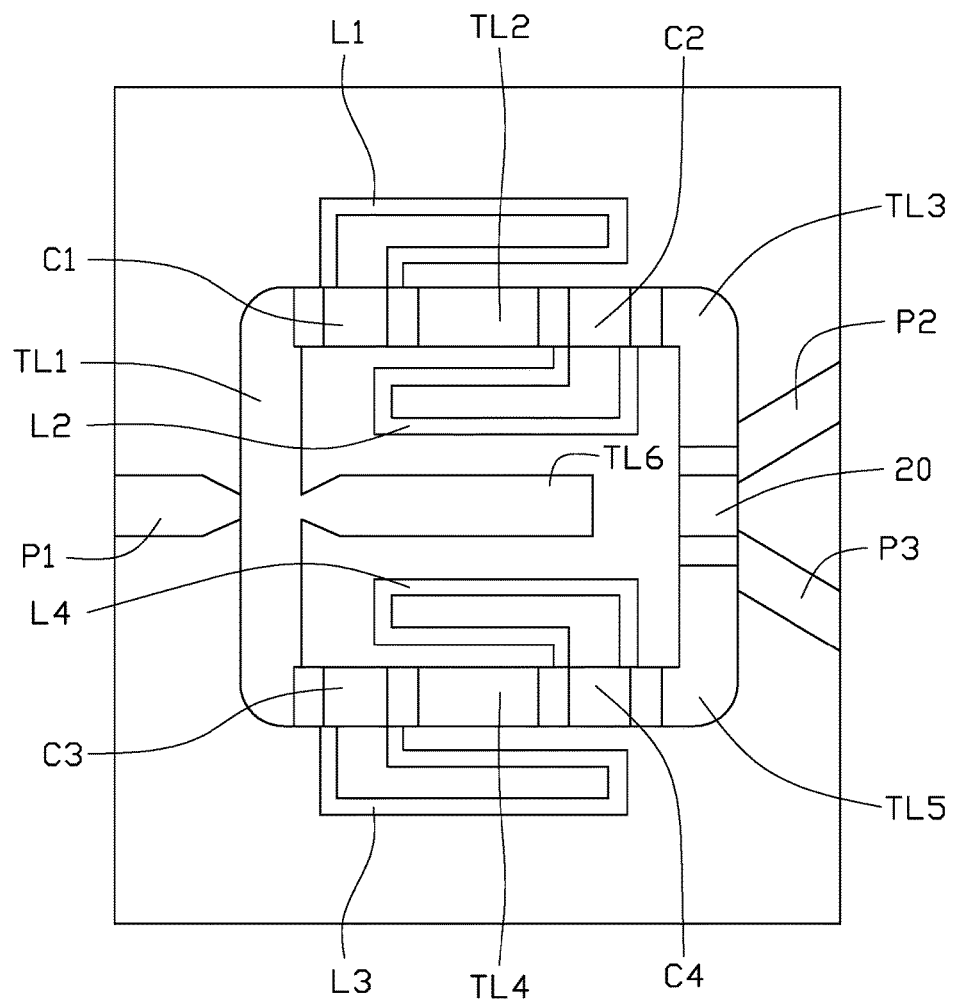
FIG. 3 is a structure diagram of an embodiment of a power dividing circuit of the present disclosure.

FIGS. 2 and 3 illustrate an embodiment of the power dividing circuit 100.

The power dividing circuit 100 comprises an input port P1, six microstrip lines TL1 to TL6, a matching element 20, a first transmission subcircuit 30, and a second transmission subcircuit 40. The first transmission subcircuit 30 is coupled to a first microstrip line first end, and the second transmission subcircuit 40 is coupled to a first microstrip line second end.

In one embodiment, the input port P1 is coupled to a first microstrip line middle end.

In one embodiment, the first transmission subcircuit 30 and the second transmission subcircuit 40 have the same circuit. The first transmission subcircuit 30 and the second transmission subcircuit 40 generate the same resonance frequency to reduce high frequency harmonics. The first transmission subcircuit 30 and the second transmission subcircuit 40 are symmetrically installed on the basal board 300 upper surface.

In one embodiment, the first transmission subcircuit 30 comprises a first resonance unit 32 and a first output port P2. The first resonance unit 32 is coupled between the input port P1 and the first output port P2. The first resonance unit 32 comprises a first resonator Q1 and a second resonator Q2. The first resonator Q1 is coupled to the second resonator Q2 in series. The first resonator Q1 comprises a first capacitor C1 and a first inductor L1. The first capacitor C1 is coupled to the first inductor L1 in parallel. The second resonator Q2 comprises a second capacitor C2 and a second inductor L2. The second capacitor C2 is coupled to the second inductor L2 in parallel.

The first transmission subcircuit 30 further comprises a second microstrip line TL2 and a third microstrip line TL3. The second microstrip line TL2 is coupled between the first resonator Q1 and the second resonator Q2, and the third microstrip line TL3 is coupled between the second resonator Q2 and the first output port P2.

In one embodiment, the second transmission subcircuit 40 comprises a second resonance unit 42 and a second output port P3. The second resonance unit 42 is coupled between the input port P1 and the second output port P3. The second resonance unit 42 comprises a third resonator Q3 and a fourth resonator Q4. The third resonator Q3 is coupled to the fourth resonator Q4 in series. The third resonator Q3 comprises a third capacitor C3 and a third inductor L3. The third capacitor C3 is coupled to the third inductor L3 in parallel. The fourth resonator Q4 comprises a fourth capacitor C4 and a fourth inductor L4. The fourth capacitor C4 is coupled to the fourth inductor L4 in parallel.

The second transmission subcircuit 40 further comprises a fourth microstrip line TL4 and a fifth microstrip line TL5. The fourth microstrip line TL4 is coupled between the third resonator Q3 and the fourth resonator Q4, and the fifth microstrip line TL5 is coupled between the fourth resonator Q4 and the second output port P3.

A sixth microstrip line first end is coupled to the input port P1, and a sixth microstrip line second end is unconnected. The sixth microstrip line TL6 is configured to match impedance of the input port P1.

The matching element 20 is coupled between the first output port P2 and the second output port P3. The matching element 20 is configured to match impedance between the first transmission subcircuit 30 and the second transmission subcircuit 40.

In one embodiment, the matching element 20 is further configured to isolate the first transmission subcircuit 30 and the second transmission subcircuit 40. A basal board length can be 5.22 millimeter, a basal board width can be 4.1 millimeter, and a basal board thickness can be 0.254 millimeter. The matching element 20 can be a resistor, a resistance of the matching element 20 can be 100 ohms. A power divider operation frequency can be 2.45 gigahertz (GHz). A first capacitor capacitance can be 0.5 picofarads (pF), a second capacitor capacitance can be 0.3 pF, a third capacitor capacitance can be 0.5 pF, and a fourth capacitor capacitance can be 0.3 pF. A first inductor inductance can be 2 nanohenrys (nH), a second inductor inductance can be 2.1 nH, a third inductor inductance can be 2 nH, and a fourth inductor inductance can be 2.1 nH.

When the first capacitor capacitance or the first inductor inductance is adjusted, a first resonator resonance frequency is also adjusted. The second resonator Q2, the third resonator Q3, and the fourth resonator Q4 can be similarly adjusted.

Figure 4:
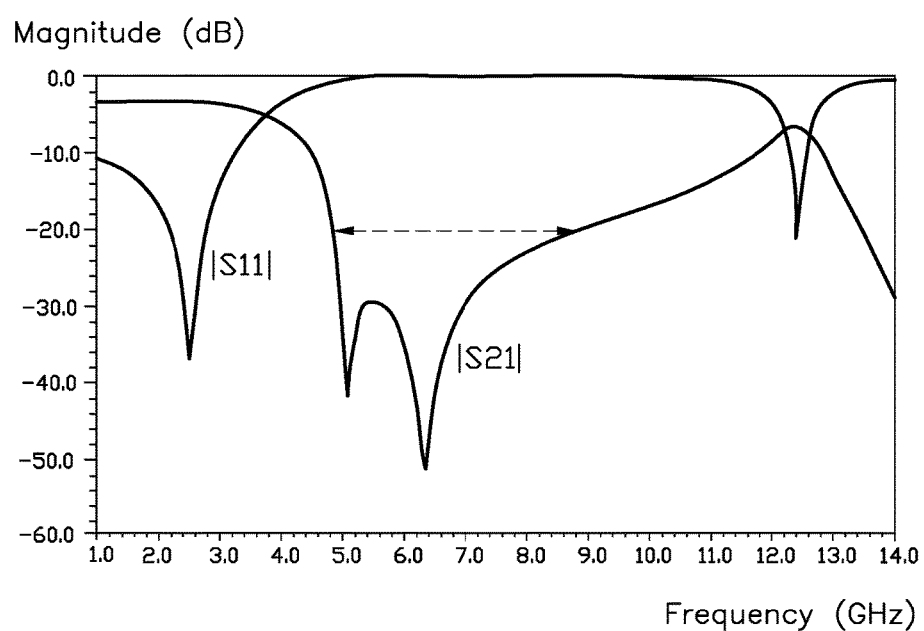
FIG. 4 is a diagram showing a simulated performance of an embodiment of the power divider of FIG. 1 of the present disclosure.

FIG. 4 illustrates performance of the power divider 200.

When a high frequency harmonics frequency is 5 GHz-8.4 GHz, the power divider 200 has good high frequency harmonics reducing effect, a return loss S21 is less than −20 dB.

When an input carrier signal is inputted to the input port P1, the input carrier signal is divided into a first signal and a second signal via the first transmission subcircuit 30 and the second transmission subcircuit 40. The first signal is transmitted to the first output port P2, and the second signal is transmitted to the second output port P3. Thereby, the power dividing circuit realizes power dividing function.

When the first signal is transmitted to the first output port P2 via the first transmission subcircuit 30 and the matching element 20, the first resonator Q1 and the second resonator Q2 generate two difference resonance frequency signals to reduce high frequency harmonics.

In one embodiment, three or more resonators are coupled in series between the input port P1 and the first output port P2 to generate three or more difference resonance frequency signals to reduce high frequency harmonics. Three or more resonators are coupled in series between the input port P1 and the second output port P3 to generate three or more difference resonance frequency signals to reduce high frequency harmonics.

In one embodiment, the power divider 200 can comprise two or more power dividing circuits 100 to improve filtering performance of the power divider 200.

While the disclosure has been described by way of example and in terms of the embodiment, it is to be understood that the disclosure is not limited thereto. On the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A power dividing circuit, comprising:
an input port;
a first microstrip line;
a first transmission subcircuit, coupled to a first microstrip line first end, comprising:
an first output port; and
a first resonance unit, coupled between the input port and the first output port;
a second transmission subcircuit, coupled to a first microstrip line second end, comprising:
an second output port; and
a second resonance unit, coupled between the input port and the second output port;
a sixth microstrip line, the sixth microstrip line configured to match impedances of the input port; and a sixth microstrip line first end coupled to the input port, and a sixth microstrip line second end being unconnected; and
a matching element coupled between the first output port and the second output port and configured to match impedances between the first transmission subcircuit and the second transmission subcircuit;
wherein the first transmission subcircuit and the second transmission subcircuit have the same circuit.

2. The power dividing circuit of claim 1, wherein the first transmission subcircuit further comprises a second microstrip line and a third microstrip line, the first resonance unit comprises a first resonator and a second resonator; and the first resonator is coupled to the second resonator in series, the second microstrip line is coupled between the first resonator and the second resonator, and the third microstrip line is coupled between the second resonator and the first output port.

3. The power dividing circuit of claim 2, wherein the first resonator comprises a first capacitor and a first inductor, the second resonator comprises a second capacitor and a second inductor; and the first capacitor is coupled to the first inductor in parallel, and the second capacitor is coupled to the second inductor in parallel.

4. The power dividing circuit of claim 1, wherein the second transmission subcircuit further comprises a fourth microstrip line and a fifth microstrip line, the second resonance unit comprises a third resonator and a fourth resonator; and the third resonator is coupled to the fourth resonator in series, the fourth microstrip line is coupled between the third resonator and the fourth resonator, and the fifth microstrip line is coupled between the fourth resonator and the second output port.

5. The power dividing circuit of claim 4, wherein the third resonator comprises a third capacitor and a third inductor, the fourth resonator comprises a fourth capacitor and a fourth inductor; and the third capacitor is coupled to the third inductor in parallel, and the fourth capacitor is coupled to the fourth inductor in parallel.

6. The power dividing circuit of claim 1, wherein the matching element is further configured to isolate the first transmission subcircuit and the second transmission subcircuit.

7. A power divider, comprising:
a basal board;
a grounded board, attached to a basal board lower surface; and
a power dividing circuit, installed on a basal board upper surface, the power dividing circuit comprising:
an input port;
a first microstrip line;
a first transmission subcircuit, coupled to a first microstrip line first end, comprising:
an first output port; and
a first resonance unit, coupled between the input port and the first output port; and
a second transmission subcircuit, coupled to a first microstrip line second end, comprising:
an second output port; and
a second resonance unit, coupled between the input port and the second output port;
a sixth microstrip line, the sixth microstrip line configured to match impedances of the input port; and a sixth microstrip line first end coupled to the input port, and a sixth microstrip line second end being unconnected; and a matching element coupled between the first output port and the second output port, and configured to match impedances between the first transmission subcircuit and the second transmission subcircuit;

wherein the first transmission subcircuit and the second transmission subcircuit have the same circuit.

8. The power divider of claim 7, wherein the first transmission subcircuit further comprises a second microstrip line and a third microstrip line, the first resonance unit comprises a first resonator and a second resonator; and the first resonator is coupled to the second resonator in series, the second microstrip line is coupled between the first resonator and the second resonator, and the third microstrip line is coupled between the second resonator and the first output port.

9. The power divider of claim 8, wherein the first resonator comprises a first capacitor and a first inductor, the second resonator comprises a second capacitor and a second inductor; and the first capacitor is coupled to the first inductor in parallel, and the second capacitor is coupled to the second inductor in parallel.

10. The power divider of claim 7, wherein the second transmission subcircuit further comprises a fourth microstrip line and a fifth microstrip line, the second resonance unit comprises a third resonator and a fourth resonator; and the third resonator is coupled to the fourth resonator in series, the fourth microstrip line is coupled between the third resonator and the fourth resonator, and the fifth microstrip line is coupled between the fourth resonator and the second output port.

11. The power divider of claim 10, wherein the third resonator comprises a third capacitor and a third inductor, the fourth resonator comprises a fourth capacitor and a fourth inductor; and the third capacitor is coupled to the third inductor in parallel, and the fourth capacitor is coupled to the fourth inductor in parallel.

12. The power divider of claim 7, wherein the matching element is further configured to isolate the first transmission subcircuit and the second transmission subcircuit.

* * * * *